United States Patent
Reinhold et al.

(10) Patent No.: US 12,293,890 B2
(45) Date of Patent: May 6, 2025

(54) CONTACT MONITORING APPARATUS FOR A THREE-POLE CHANGEOVER CONTACT

(71) Applicant: Phoenix Contact GmbH & Co.KG, Blomberg (DE)

(72) Inventors: Christian Reinhold, Hameln (DE); Peter Scholz, Brakel (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 18/559,570

(22) PCT Filed: May 10, 2022

(86) PCT No.: PCT/EP2022/062552
§ 371 (c)(1),
(2) Date: Nov. 8, 2023

(87) PCT Pub. No.: WO2022/238361
PCT Pub. Date: Nov. 17, 2022

(65) Prior Publication Data
US 2024/0234060 A1    Jul. 11, 2024

(30) Foreign Application Priority Data
May 12, 2021    (BE) .................................. 2021/5383

(51) Int. Cl.
*G01R 31/327*    (2006.01)
*H01H 47/00*    (2006.01)
(52) U.S. Cl.
CPC ....... *H01H 47/002* (2013.01); *G01R 31/3278* (2013.01)

(58) Field of Classification Search
CPC .. G01R 31/3278; H01H 47/002; H01H 9/167; H02J 50/12; H02J 7/00304;
(Continued)

(56) References Cited

U.S. PATENT DOCUMENTS 5,869,968 A * 2/1999 Brooks ..................... G01V 3/30
324/338
10,955,477 B2 * 3/2021 Robertson ............ H01H 47/002
(Continued)

FOREIGN PATENT DOCUMENTS

CN    109283462 A    1/2019
DE    2806294 A1    8/1978
(Continued)

*Primary Examiner* — Vinh P Nguyen
(74) *Attorney, Agent, or Firm* — LEYDIG, VOIT & MAYER, LTD.

(57) ABSTRACT

A contact monitoring means for monitoring an electrical, three-pole changeover contact includes: a signal generator, which generates a monitoring signal; a coupling means, which is connected downstream from the signal generator; a sensing circuit, which is connected downstream from the coupling means and which is coupled or can be coupled to the changeover contact. The monitoring signal generation of the signal generator and thus the monitoring signal and/or a signal derived from the monitoring signal can be changed as a function of a switching position of the changeover contact by means of the sensing circuit, which is coupled to the signal generator via the coupling means. The contact monitoring means also includes an evaluation means, which detects the monitoring signal and/or the signal derived from the monitoring signal and/or a change of the monitoring signal and/or a change of the signal derived from the monitoring signal.

19 Claims, 8 Drawing Sheets

(58) Field of Classification Search
CPC ........ H02J 7/00308; H02J 50/90; H02J 50/50; H03B 5/1218; H03B 5/1296; H03H 19/002
See application file for complete search history.

(56) References Cited

U.S. PATENT DOCUMENTS

| | | | |
|---|---|---|---|
| 11,486,929 B1* | 11/2022 | Curtis | G01R 31/3278 |
| 11,774,501 B2* | 10/2023 | Scholz | G01R 31/3278 |
| | | | 324/423 |
| 11,994,836 B2* | 5/2024 | Garcia | H01H 71/04 |
| 2016/0146889 A1* | 5/2016 | Voß | H03K 17/18 |
| | | | 324/415 |
| 2019/0096611 A1* | 3/2019 | Papenbreer | H01H 9/54 |
| 2019/0101593 A1* | 4/2019 | Grazioli | G01R 31/3278 |
| 2020/0096571 A1* | 3/2020 | Hanai | G01R 31/3278 |

FOREIGN PATENT DOCUMENTS

| | | |
|---|---|---|
| DE | 2729480 A1 | 1/1979 |
| DE | 4221916 A1 | 1/1994 |
| DE | 102018217135 A | 10/2019 |
| EP | 1202313 A1 | 5/2002 |
| EP | 3396692 A1 | 10/2018 |

\* cited by examiner

| State | Contact position | Equivalent Circuit Diagram | Impedance at the transmitter |
|---|---|---|---|
| 1 | NC NO ○ ○ˏ○ COM | | $Z_{NC}=((Z_{133}+Z_{136}+Z_{134}) \| Z_{132})+Z_{131}$ |
| 2 | NC NO ○ˏ○ ○ COM | | $Z_{NO}=((Z_{132}+Z_{135}+Z_{134}) \| Z_{133})+Z_{131}$ |
| 3 | NC NO ●━━● COM | | $Z_s=(Z_{132} \| Z_{133})+Z_{131}$ |
| 4 | NC NO ○ ○ COM | | $Z_o=((Z_{133}+Z_{136}) \| (Z_{132}+Z_{135}))+Z_{131}+Z_{134}$ |

Fig. 4

| State | Contact position | Equivalent Circuit Diagram | Impedance at the transmitter |
|---|---|---|---|
| 1 | NC o—/ o NO, COM |  | $Z_{NC} = Z_{132}$ |
| 2 | NC o / —o NO, COM |  | $Z_{NO} = Z_{133}$ |
| 3 | NC •——• NO, COM |  | $Z_s = Z_{132} \| Z_{133}$ |
| 4 | NC o  o NO, COM |  | $Z_o$ = High Impedance |

| State | Contact position | $S_{M1}$ | $S_{M2}$ | $S_M$ |
|---|---|---|---|---|
| 1 | NC NO ○—/○ COM | value/level/state: closed | value/level/state: open | closed/open |
| 2 | NC NO ○ ○ COM | value/level/state: open | value/level/state: closed | open/closed |
| 3 | NC NO ●—●—● COM | value/level/state: closed | value/level/state: closed | closed/open |
| 4 | NC NO ○ ○ COM | value/level/state: open | value/level/state: open | open/open |

Fig. 8

CONTACT MONITORING APPARATUS FOR A THREE-POLE CHANGEOVER CONTACT

CROSS-REFERENCE TO PRIOR APPLICATIONS

This application is a U.S. National Phase application under 35 U.S.C. § 371 of International Application No. PCT/EP2022/062552, filed on May 10, 2022, and claims benefit to Belgian Patent Application No. BE 2021/5383, filed on May 12, 2021. The International Application was published in German on Nov. 17, 2022 as WO/2022/238361 under PCT Article 21(2).

FIELD

The invention relates to a contact monitoring device for monitoring an electrical, three-pole changeover contact (e.g. of a relay), in particular for monitoring a switching process of the changeover contact.

BACKGROUND

Changeover contacts with three ports are generally known in the prior art, wherein the ports are, for the most part, referred to as COM port ("common"), NC port ("normally closed") and NO port ("normally open"). A changeover contact typically has the task of establishing an electrical contact between a common port, the COM port, and one of the two further ports, the NC or NO port. During normal operation, the changeover contact thus has two operating states, that is to say, the COM port is either connected to the NC port or the COM port is connected to the NO port.

In addition to the two above-mentioned states, which can also occur in the event of a disrupted operation of the changeover contact (e.g. when the COM port and the NC or NO port, respectively, are welded together), further switching states can also occur in the event of an error. As a result of worn contact beads, e.g., there can thus be no connection whatsoever between the three ports. Alternatively, all three ports can also be connected to one another, for example by device of an arc or by device of a welding of the contacts as a result of thermal and/or electrical overload. The NC port can furthermore also be connected only to the NO port, but both in each case not to the COM port, wherein this state typically plays a rather subordinate role due to the setup of a relay. As a whole, a number of (error) states can thus occur in the case of changeover contacts, which is why in practice there is a need for a simple and reliable option for detecting or monitoring respectively, the switching state of a changeover contact.

The principle of evaluating the switching state of a contact by imprinting a test signal thereon, is thereby known from DE 28 06 294 A1. However, the contact therein is only a contact with two switching states.

A method for monitoring a switch position of mechanical switching contacts is further known from EP 1 202 313 A1, wherein the method requires two coupling transformers. Only two switching states can furthermore be differentiated by device of the above-mentioned method.

Similar solutions for the changeover contact monitoring are also known from the documents EP 3 396 692 A1, DE 27 29 480 A1, DE 42 21 916 A1, and DE 10 2018 217 135 A1. It is a disadvantage of all of these approaches, however, that only two switch positions can be differentiated with them. In particular in the case of the approach of the DE 10 2018 217 135 A1, the state that all three ports, i.e. the COM, NC and NO port, are connected to one another (e.g. by device of a welding of the contacts) would thereby be interpreted erroneously as a correct function of the switch, even though an error case can be present.

SUMMARY

In an embodiment, the present invention provides a contact monitoring device for monitoring an electrical, three-pole changeover contact, comprising: a signal generator, which is configured to generate a monitoring signal; a coupling device, which is connected downstream from the signal generator; a sensing circuit, which is connected downstream from the coupling device and which is coupled or can be coupled to the changeover contact; wherein the monitoring signal generation of the signal generator and thus the monitoring signal and/or a signal derived from the monitoring signal can be changed as a function of a switching position of the changeover contact by device of the sensing circuit, which is coupled to the signal generator via the coupling device; an evaluation device, which is configured to detect the monitoring signal and/or the signal derived from the monitoring signal and/or a change of the monitoring signal and/or a change of the signal derived from the monitoring signal, in order to thus monitor the changeover contact, wherein the sensing circuit is configured to change the monitoring signal and/or the signal derived from the monitoring signal in a different way for at least three different switch positions of the changeover contact.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 4: shows a tabular list of selected states of the changeover contact and the interconnection of the impendences resulting therefrom for the embodiment shown in FIG. 3;

FIG. 8: shows a tabular list of selected states of the changeover contact and the monitoring signals resulting therefrom for the embodiment shown in FIG. 7.

DETAILED DESCRIPTION

Figure 1:
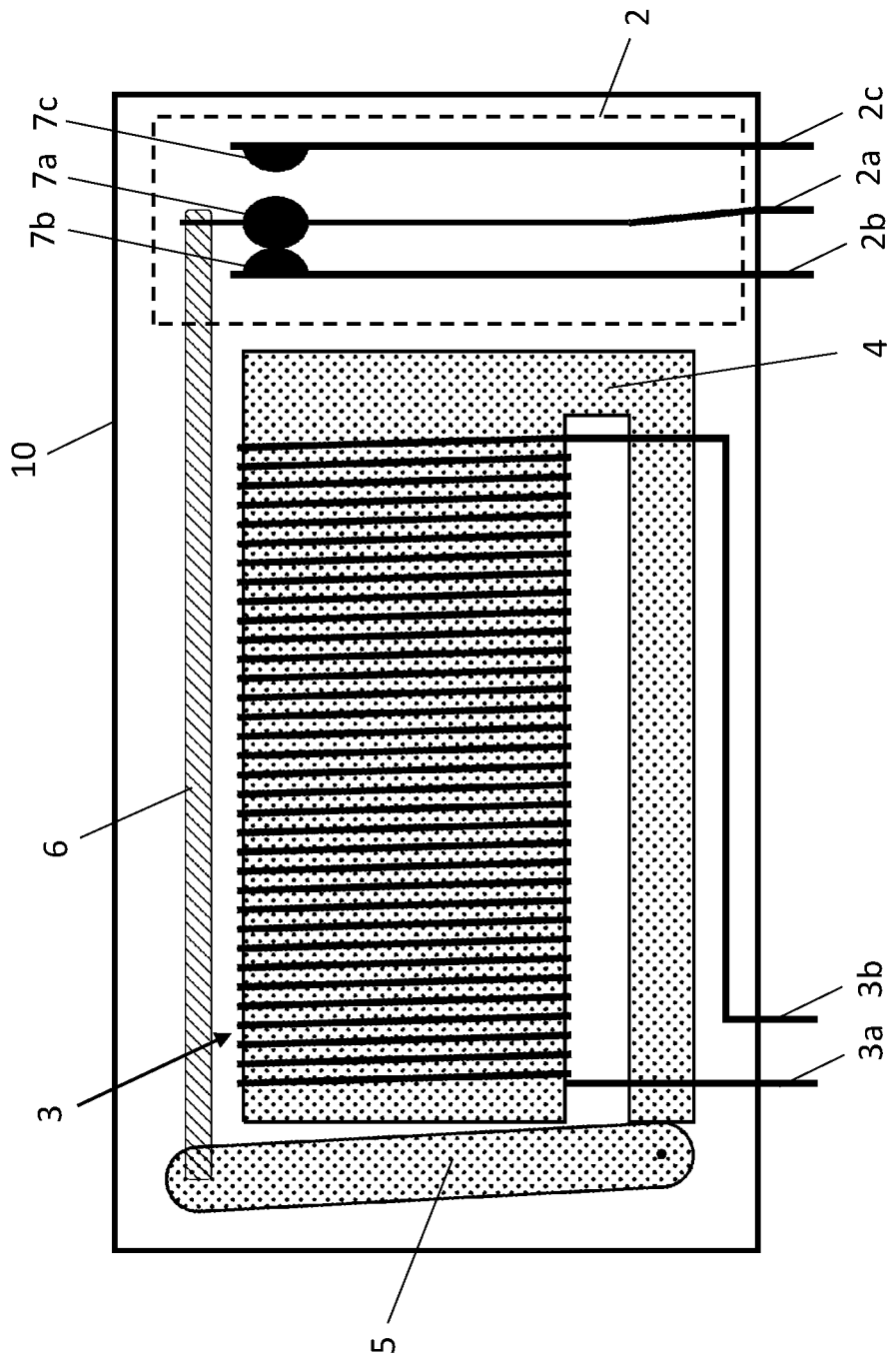
FIG. 1: shows a schematic illustration of a three ole-three-pole changeover contact according to a general embodiment.

In an embodiment, the present invention provides an option, which is as cost-efficient as possible, for monitoring a three-pole changeover switch, by device of which the disadvantages of the current solutions are avoided. In an embodiment, the invention provides a solution, by device of which as many error or switching states, respectively, as possible of a changeover switch can be detected, preferably independently of an external circuit of the changeover contact.

According to a first aspect, the disclosure relates to a contact monitoring device for monitoring an electrical, three-pole changeover contact (e.g. of a relay changeover contact). The changeover contact can thereby comprise three ports, which will be referred to below as COM port, NC port, and NO port.

The contact monitoring device comprises a signal generator, which is configured to generate a monitoring signal. The signal generator can thereby be, for example, an oscillator circuit, e.g. a Colpitts oscillator circuit. The monitoring signal is preferably a high-frequency monitoring signal, i.e. a signal in the high frequency range. For example, the monitoring signal can have a frequency of at least 10 kHz, preferably of at least 100 kHz, or more preferably of at least 1 MHZ. The monitoring signal is preferably a voltage signal, but the monitoring signal can additionally or alternatively also be a current signal and/or a power signal.

The contact monitoring device further comprises a, preferably exclusively one, coupling device (e.g. a transformer), which is connected downstream from the signal generator, and a sensing circuit, which is connected downstream from the coupling device. I.e., in other words, the sensing circuit is coupled to the signal generator via the coupling device. The coupling device is thereby preferably an inductive coupling device and/or is configured to galvanically separate the sensing circuit from the signal generator. The sensing circuit, in turn, is coupled to the changeover contact or can be coupled thereto. The sensing circuit is thereby preferably coupled to each port of the changeover contact or can be coupled thereto.

It is provided thereby that the monitoring signal generation of the signal generator and thus the monitoring signal and/or a signal derived from the monitoring signal can be changed as a function of a switching position of the changeover contact by device of the sensing circuit, which is coupled to the signal generator via the coupling device. In other words, the sensing circuit can be configured to change the monitoring signal generation of the signal generator and thus the monitoring signal and/or a signal derived from the monitoring signal as a function of a switching position of the changeover contact via the coupling of said sensing circuit to the signal generator via the coupling device. The sensing circuit can be configured, e.g., only in an exemplary manner, to change the amplitude and/or frequency of the generated monitoring signal and/or of the signal derived from the monitoring signal as a function of the switching position of the changeover contact by influencing the vibration behavior of the signal generator. A signal derived from the monitoring signal is to thereby be understood to be a signal, which is functionally associated with the monitoring signal (e.g. is proportional thereto) and/or can be generated from it or converted, respectively. For example, the monitoring signal can be a voltage signal, and the signal derived from the monitoring signal can be a current signal. The sensing circuit is further configured to change the monitoring signal and/or the signal derived from the monitoring signal in a different way for at least three, preferably four, particularly preferably five, different switch positions of the changeover contact. "Changing" can thereby generally also be understood to be an "influencing" or "varying".

In other words, a change or influencing of the monitoring signal, respectively, which is characteristic for the respective switch position, can take place for each of the switch positions, which then results, e.g., in an amplitude of the monitoring signal, which is different for each of the switch positions.

The contact monitoring device furthermore comprises an evaluation device, which is configured to detect the monitoring signal and/or the signal derived from the monitoring signal and/or a change of the monitoring signal and/or a change of the signal derived from the monitoring signal, in order to thus monitor the changeover contact. For example, the evaluation device can detect the current amplitude of the monitoring signal and/or an amplitude change of the monitoring signal, and, on the basis thereof, determine, e.g., the current actual switching state of the changeover contact, which can then, in turn, be compared, e.g., to a specified target switching state. In the event that the monitoring signal is a pulse-like monitoring signal, the detection of a change of the monitoring signal can be, e.g., a detection of a pulse response. As a whole, a plurality of different switch positions of the changeover contact can thus be detected or monitored, respectively, in an advantageous manner, whereby a reliable diagnosis of the current state of the changeover contact is made possible. An unambiguous detection of the contact state of the changeover contact can thus be realized in particular under the aspect of the functional safety (e.g. according to the standard IEC 61508), and a high degree of diagnostic coverage can be attained accordingly.

According to a first aspect of the invention, the sensing circuit can be configured to change an amplitude, a frequency, a phase position, a decay behavior, a runtime and/or a signal form of the monitoring signal as a function of the switch position of the changeover contact. Additionally or alternatively, the sensing circuit can also be configured to change an amplitude, a frequency, a phase position, a decay behavior, a runtime and/or a signal form of the signal derived from the monitoring signal as a function of the switch position of the changeover contact. For example, the sensing circuit can be configured to increase the amplitude of the monitoring signal, based on a first switch position (initial position), if the changeover contact is transferred into a second switch position, and to lower it compared to the amplitude in the first switch position, if the changeover contact is transferred into a third switch position. The monitoring signal can thereby be a continuous monitoring signal or a pulse-like monitoring signal. The sensing circuit can thereby generally be dimensioned to change the same respective parameter(s) of the monitoring signal and/or of the signal derived from the monitoring signal as a function of the switch position (e.g. always the frequency). Alternatively, the sensing circuit can also be configured (e.g. dimensioned) to at least partially change different respective parameters of the monitoring signal and/or to at least partially change the signal derived from the monitoring signal as a function of the switch position (e.g. the frequency in a first switch position and the amplitude in a second switch position). The changing or influencing, respectively, of the above-mentioned parameters of the monitoring signal and/or of the signal derived from the monitoring signal can thereby take place, e.g., by coupling variables, which influence the vibration behavior of the signal generator (such as, e.g., an impedance) into the signal generator as a function of the switch position.

According to a further aspect of the invention, the changeover contact can comprise a, preferably common, COM port, an NC port and an NO port. The sensing circuit can further be configured to change the monitoring signal and/or the signal derived from the monitoring signal in a different way in each case for at least three, preferably four, particularly preferably all of the following switch positions. In other words, the contact monitoring device as a whole can be configured to provide a different monitoring signal for at least three, preferably four, particularly preferably all of the following switch positions in each case. The corresponding switch positions, which can also be referred to as switching states, are thereby:
1. no connection between the COM port, the NC port, and the NO port;
2. only the COM port and the NC port are connected;
3. only the COM port and the NO port are connected;
4. only the NC port and the NO port are connected;
5. all ports, i.e. the COM port, the NC port, and the NO port are connected.

The advantage of the fact that different monitoring signals, i.e. which are characteristic for the respective switch position, can be generated by the signal generator in each case for as many of the corresponding switch positions as possible, is that an unambiguous assignment of the individual switching states can take place in this way, whereby a diagnosis, which is as accurate as possible, of the changeover contact is made possible in an advantageous manner.

According to a further aspect of the invention, the sensing circuit can comprise one or several impedances.

The sensing circuit can further be configured to provide, with the changeover contact, a total impedance, which varies with the switch positions of the changeover contact, at the coupling device. In other words, the sensing circuit can be configured to change the total impedance applied at the coupling device as a function of the switch positions of the changeover contact. This changed total impedance can then result in the signal generator or in the oscillator circuit, respectively, in a change of the monitoring signal generated there. For example, an increase of the total impedance can effect a decrease of the amplitude of the monitoring signal.

Additionally or alternatively, the sensing circuit can also be configured to provide a respective different total impedance at the coupling device for at least three, preferably four, particularly preferably five switch positions of the changeover contact. For example, a first total impedance can be provided for a first switch position, a second total impedance can be provided for a second switch position, etc. In other words, the sensing circuit can be configured to set, with the changeover contact, a respective characteristic total impedance at the coupling device for at least three, preferably four, particularly preferably five switch positions, which total impedance is then coupled via the coupling device into the signal generator in order to change the monitoring signal generated there. A simple option for the variation of the vibration signal can thus be provided as a whole in an advantageous manner as a function of the switch position, which then provides for a reliable monitoring of the changeover contact.

According to a further aspect of the invention, the sensing circuit can comprise a first impedance, which can be coupled or is coupled to a port of the changeover contact, preferably the COM port. The first impedance is thereby preferably formed in the form of a series connection of a resistor and a capacitor, wherein, to make differentiation easier, the resistor or the capacitor, respectively, will be identified below as "first" resistor and "first" capacitor.

Additionally or alternatively, the sensing circuit can also comprise a second impedance, which can be coupled or is coupled to a further port of the changeover contact, preferably the NC port. This second impedance is thereby preferably also configured in the form of a series connection of a "second" resistor and a "second" capacitor. Additionally or alternatively, the sensing circuit can also comprise a third impedance, which can be coupled or is coupled to a further port of the changeover contact, preferably the NO port. Said third impedance is preferably also configured in the form of a series connection of a "third" resistor and a "third" capacitor. A corresponding interconnection of impedances can thus be provided in an advantageous manner, which makes it possible to vary the total impedance applied at the coupling device and thus the monitoring signal generation as a function of the switch positions of the changeover contact, whereby a monitoring or determination, respectively, of the changeover contact state is made possible in a simple way.

According to a further aspect of the invention, the sensing circuit can comprise one to three further impedances, which, for the purpose of better differentiation, will be identified below as fourth, fifth, and sixth impedance. The respective impedance can thereby in each case be connected downstream from a port of the changeover contact. For example, the fourth impedance can be connected downstream from the COM port, the fifth impedance can be connected downstream from the NC port and/or the sixth impedance can be connected downstream from the NO port. The corresponding impedances, which can comprise, e.g., an inductor or a ferrite, can thereby serve the purpose of attenuating high-frequency signals, which are applied by device of the coupling device at the changeover contact and/or at an electrical load and/or voltage source coupled to the changeover contact. In other words, the fourth, fifth and/or sixth impedance can act as filter elements, whereby other options for filtering, which are known to the person of skill in the art, can also be used instead of impedances. The impedances or the filter elements, respectively, are thereby preferably highly resistive in a frequency range from 100 kHz to 100 MHZ, so that the monitoring signal is not applied or only with reduced signal amplitude, respectively, at the loads, which are optionally connected to the changeover contact. A reliable monitoring of the changeover contact can thus be attained in an advantageous manner, which quasi does not represent a negative impact for corresponding useful signals. In other words, the contact monitoring device for typical DC or low-frequency useful signals is not or hardly noticeable, respectively, "viewed from the outside".

According to a further aspect of the invention, the sensing circuit can comprise at least one further impedance, wherein the at least one further impedance is in each case connected between two ports of the changeover contact. The sensing circuit thereby preferably comprises one, two, or three further impedances, which, for the purpose of better differentiation, will be identified below as seventh, eighth, and ninth impedance. The seventh impedance can be connected, for example, between the COM port and the NO port, the eighth impedance can be connected between the COM port and the NC port and/or the ninth impedance can be connected between the NO port and the NC port. The seventh impedance is thereby preferably configured in the form of a series connection of an inductor and a capacitor, whereby, for the purpose of better differentiation, these will be identified below as seventh inductor and seventh capacitor. The eighth impedance can likewise also preferably be configured in the form of a series connection of an eighth inductor and an eighth capacitor. Lastly, the ninth impedance can preferably also be configured in the form of a series connection of a ninth inductor and a ninth capacitor. The corresponding impedances can thereby serve the purpose of attenuating high-frequency signals between the ports of the changeover contact. The above-mentioned LC series resonant circuits thereby preferably comprise a series resonance frequency, which lies in the range of the frequency of the monitoring signal. In the case of the series resonance frequency, the impedance of the series resonant circuit is thus given only due to resistive portions of the inductor and of the capacitor and is thus very low. It can be attained thereby in an advantageous manner that, on the one hand, voltage signals between the ports and thus electromagnetic interference emissions are reduced and, on the other hand, the influence of the sensing circuit is minimized due to optionally connected loads at the operating frequency of the signal generator because they are connected in parallel to the low seventh or eighth impedance, respectively.

According to a further aspect of the invention, the changeover contact can be a changeover contact of a relay. In this context, the changeover contact can also be identified as relay changeover contact. The relay can thereby be, e.g., an electromechanical relay, in the case of which the changeover contact can be switched by device of a relay coil and a movable relay armature. Alternatively, however, the relay can also be a semiconductor relay. Additionally or alternatively, the contact monitoring device can also be part of a relay socket. In other words, the contact monitoring device can be integrated in a relay socket. The contact monitoring device is thereby preferably encased by a relay socket housing.

According to a further aspect of the invention, the coupling device can be an inductive transmitter. The coupling device can, for example, comprise a transformer, which can comprise a first inductor (e.g. a first air coil) and a second inductor (e.g. a second air coil), wherein the first inductor can be inductively coupled to the second inductor (e.g. via a ferrite or magnetic core). The advantage of a corresponding embodiment with air coils is thereby that the coils can be capable of being produced by device of printed circuit board technique and a number of discrete electronic components can accordingly be reduced during a production of the contact monitoring device. Additionally or alternatively, the coupling device can be configured to galvanically separate the signal generator and the sensing circuit. Alternatively, however, the coupling device can also be formed as a direct galvanic connection of the sensing circuit to the signal generator (e.g. in the form of a cable or conductor connection, respectively). Additionally or alternatively, the coupling device can also be configured of at least two electromagnetically coupled antennas. Additionally or alternatively, the coupling device can also be configured of at least two capacitors. The two capacitors are thereby preferably embodied as printed circuit board capacitors.

According to a further aspect of the invention, the signal generator can be a high-frequency generator, which is configured to generate a high-frequency monitoring signal. For example, the monitoring signal can comprise a frequency of at least 10 kHz, preferably of at least 100 kHz, or more preferably of at least 1 MHZ. The advantage that a frequency separation of the monitoring signal and of the useful signal switched by the changeover contact can be realized by device of cost-efficient frequency filter elements, can in particular be attained thereby. Additionally or alternatively, the signal generator can also comprise a Colpitts oscillator circuit. Additionally or alternatively, the signal generator can be connected to the changeover contact via the coupling device and the sensing circuit, for example in parallel.

According to a further aspect of the invention, the signal generator can comprise a tap (e.g. a voltage tap). The signal generator can further be configured to provide the monitoring signal and/or a signal derived from the monitoring signal, via the tap of the evaluation device. In other words, the evaluation device can be connected to the signal generator via the tap. A simple connection of the evaluation device to the signal generator can thus be realized in a simple way.

According to a further aspect of the invention, the monitoring signal can comprise at least a first monitoring subsignal and a second monitoring subsignal. For example, the first monitoring subsignal can comprise a frequency, which differs from the second monitoring subsignal and/or a different signal form and/or can be generated at a different point in time. In other words, the first monitoring subsignal and the second monitoring subsignal can be different or distinguishable, respectively, whereby more than two different or distinguishable monitoring subsignals, respectively (e.g. three monitoring subsignals) can generally also be used. In this context, the signal composed of all monitoring subsignals or consisting of these components, respectively, is to be understood as "monitoring signal". It can thereby furthermore be provided that the first monitoring subsignal and/or a signal derived from the first monitoring subsignal can be changed by device of the sensing circuit as a function of a switching position of a first port subset of the changeover contact, and the second monitoring subsignal and/or a signal derived from the second monitoring subsignal can be changed as a function of a switching position of a second port subset of the changeover contact. The first port subset is thereby preferably at least partially different from the second port subset. For example, the first monitoring subsignal and/or the signal derived from the first monitoring subsignal can be capable of being changed as a function of the switching state of the COM and NO port, while the second monitoring subsignal and/or the signal derived from the second monitoring subsignal can be capable of being changed as a function of the switching state of the COM and NC port. I.e., in other words, the respective monitoring subsignals and/or the signals derived from the monitoring subsignals can in each case only be assigned to a portion of the ports of the changeover contact or can react only to a change of a portion of the ports of the changeover contact, respectively.

According to a further aspect of the invention, the signal generator can comprise a first signal generator device for generating the first monitoring subsignal and a second signal generator device for generating the second monitoring subsignal. The first signal generator device can be, for example, a first high-frequency generator, which is configured to generate a high-frequency first monitoring signal, and the second signal generator device can be a second high-frequency generator, which is configured to generate a high-frequency second monitoring signal. Additionally or alternatively, the coupling device can also comprise a first coupling element (e.g. a first transformer) for coupling the first signal generator device to the sensing circuit, and a second coupling element (e.g. a second transformer) for coupling the second signal generator device to the sensing circuit. The first coupling element can be, for example, a first transformer and the second coupling element can be a second transformer, wherein other above-described types of the coupling (e.g. capacitive or in the form of a conductor connection) can generally also be used. Additionally or alternatively, the sensing circuit can also be configured to couple the first monitoring subsignal to a first port subset of the changeover contact, and to couple the second monitoring subsignal to a second port subset. In other words, the sensing circuit can be configured to couple the corresponding monitoring subsignals only to certain ports of the changeover contact in each case.

According to a further aspect of the invention, the evaluation device can be configured to output a state signal, which indicates the switch positions of the changeover contact, as a function of the monitoring signal and/or the change of the monitoring signal. Additionally or alternatively, the evaluation device can also be configured to output a state signal, which indicates the switch positions of the changeover contact, as a function of a signal derived from the monitoring signal and/or the change of the signal derived from the monitoring signal. The evaluation device can be configured, for example, to provide a state signal, which is proportional to the current amplitude, frequency, phase position and/or signal form of the monitoring signal and/or of the signal derived from the monitoring signal. The state signal thereby preferably comprises at least three, preferably four, particularly preferably five, different signal states. I.e., in other words, the state signal can characterize the actual switching state of the changeover contact. The evaluation device can further be configured to then compare the above-mentioned state signal with a target switching state signal, which is derived. e.g., from a switching signal generated by the control of the changeover contact, in order to thus monitor a proper switching process or the state of the changeover contact, respectively.

According to a further aspect of the invention, the evaluation device can be configured to detect a switching signal (e.g. generated by a control of the changeover contact) for switching the changeover contact. For this purpose, the evaluation device can be connected to the corresponding control. e.g. via a switching control port. The evaluation device can further be configured to output a control signal as a function of the switching signal as well as of the monitoring signal and/or the change of the monitoring signal, which control signal indicates whether the changeover contact is switched according to the switching signal. Additionally or alternatively, the evaluation device can also be configured to output a control signal as a function of the switching signal as well as of a signal, which is dependent on the monitoring signal, and/or the change of the signal, which is dependent on the monitoring signal, which control signal indicates whether the changeover contact is switched according to the switching signal. Only in an exemplary manner, the control signal can be a binary signal with a first signal value and a second signal value, whereby the first signal value indicates a correct switching process and the second signal value indicates a faulty switching process.

According to a further aspect of the invention, the evaluation device can further be configured to detect the monitoring signal and/or the change of the monitoring signal within a predetermined time interval, with the receipt of the switching signal, in order to determine whether the changeover contact is switched according to the switching signal within the predetermined time interval. Additionally or alternatively, the evaluation device can also be configured to detect the signal derived from the monitoring signal and/or the change of the monitoring signal and/or the change of the signal derived from the monitoring signal within a predetermined time interval, with the receipt of the switching signal, in order to determine whether the changeover contact is switched according to the switching signal within the predetermined. i.e. previously defined, time interval. The predetermined. i.e. previously defined, time interval can be, e.g., 50 ms. As a whole, a needs-based monitoring of the changeover contact can thus be realized in an advantageous manner. In one embodiment, the contact monitoring device can thereby comprise an optical display element, which is configured to display the detection of the switching signal and a corresponding detected switching of the changeover contact or a deviation from the expected switching signal, respectively.

According to a further aspect of the invention, the contact monitoring device can comprise a control for controlling the switching state of the changeover contact. In other words, the switching state of the changeover contact can be specified via the control. For this purpose, the control can be configured to output a corresponding switching signal to the changeover contact (e.g. for the energization of a relay coil assigned to the changeover contact). The control is preferably additionally also connected to the evaluation device in terms of signaling, in order to provide the switching signal and/or a target switching state signal derived therefrom to said evaluation device.

According to a further aspect of the invention, the contact monitoring device and the changeover contact can be encased by a common housing. In other words, the contact monitoring device and the changeover contact can form a structural unit. The housing thereby preferably comprises a plurality of ports, which can be configured. e.g., in the form of socket plugs. The housing can comprise, for example, a supply port 11d for the energy supply of the contact monitoring device, two control ports for controlling the switching state of the changeover contact, three load ports for connection to a load to be switched and/or an output port for outputting a state and/or control signal. As a whole, a structurally compact integration solution for monitoring a changeover contact can thus be provided in an advantageous manner. Alternatively, however, the contact monitoring device can also be a device, which is separate from the changeover contact. The contact monitoring device can, for example, be part of a module socket, into which a corresponding switching module can be plugged with a changeover contact. In this case, the contact monitoring device or the module socket, respectively, can further comprise three contact ports, which can be configured, e.g. as socket plugs and which are configured for receiving corresponding contacts on the changeover contact or switching module, respectively. The contact monitoring device or the module socket, respectively, can furthermore comprise one or several switching signal outputs for providing a switching signal for the changeover contact, wherein switching signal outputs, in turn, can be configured for receiving corresponding switching contacts on the changeover contact or switching module, respectively.

Identical or functionally equivalent elements are described with the same reference numerals in all figures and are partly not described separately.

FIG. 1 shows a schematic illustration of a three-pole changeover contact 2 according to a general embodiment. In the present case, the changeover contact 2 is thereby-only in an exemplary manner-a part of an electromechanical relay 10 or changeover relay, respectively. The relay 10 thereby comprises three ports, which are assigned to the changeover contact 2, and which will be identified below—according to the common convention—as COM port 2a, NC port 2b, and NO port 2c. The relay 10 furthermore comprises two relay coil ports 3a and 3b, via which a relay coil 3 of the relay 10 can be energized. Via the current flow, the relay coil 3 creates a magnetic field, which is guided in a magnetic core 4 and which exerts a force on a movable relay armature 5, which causes a movement of one or several of the contact elements or contact pellets 7a, 7b, 7b, respectively, which are assigned to the respective ports 2a, 2b, 2c, via a slide 6, in turn. In the present—only exemplary—case, the COM contact pellet 7a is connected, for example, to the NO contact pellet 7, if current flows through the coil 3. When the current flow through the coil 3 is interrupted, the contact pellets 7a, 7b, 7c will be moved into their original position again, e.g. due to a corresponding resilient tensioning of the COM contact element 7a, i.e. the COM contact pellet 7a is contacted with the NC contact pellet 7b in the present case. In addition to the embodiment illustrated here, in the case of which a changeover contact 2 is part of an electromechanical relay 10, the generic changeover contact 2, however, can also be integrated in another device, such as, e.g. a changeover switch.

Figure 2:
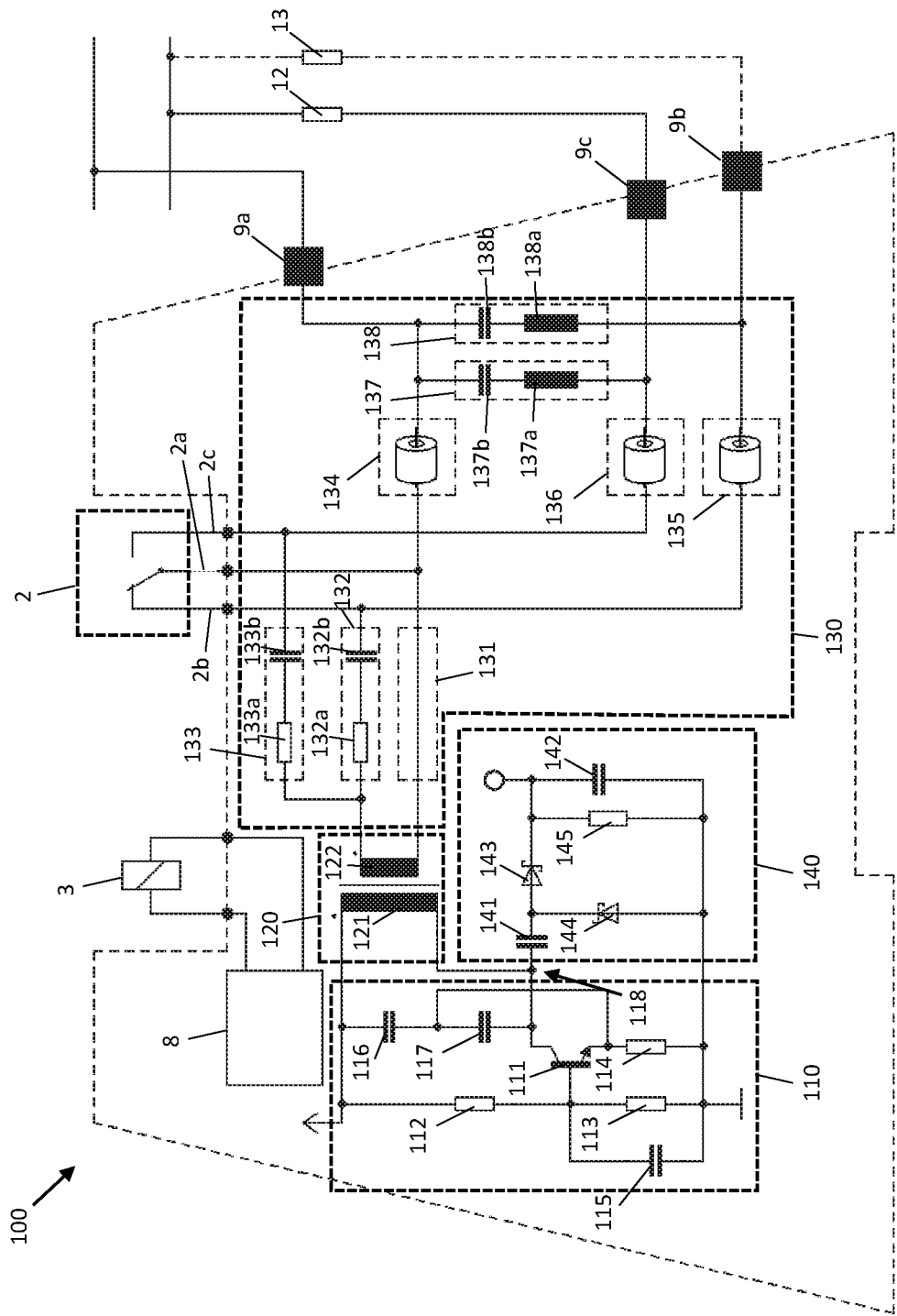
FIG. 2: shows a schematic illustration of a contact monitoring device for a three-pole changeover contact according to an embodiment of the invention.

FIG. 2 shows a schematic illustration of a contact monitoring device 100 for a three-ole changeover contact 2 according to an embodiment of the invention. A changeover contact 2 with three poles or three ports 2a. 2b. 2c, respectively, is to thereby generally be understood as "three-pole" changeover contact. The switching position of the changeover contact 2 can be specified only in an exemplary manner via a control 8, which controls a relay coil 3, wherein the relay coil 3 can cooperate with the changeover contact 2 or the contact elements thereof, respectively, as described above in connection with FIG. 1. The contact monitoring device 100 for monitoring the changeover contact 2 has a signal generator 110, which is configured to generate a monitoring signal SM. The monitoring signal Sm can generally be a high-frequency auxiliary energy. Only in an exemplary manner, the signal generator 110 can have a Colpitts oscillator for this purpose, which comprises a transistor 111, the operating point of which can be set via a base voltage divider with resistors 112 and 113 as well as an emitter resistor 114. The base of the transistor 111 is additionally connected to ground via a capacitor 115, in order to short-circuit high-frequency components applied at the base to ground in this way. The Colpitts oscillator furthermore comprises a resonant circuit, which determines the frequency of the monitoring signal SM, of two capacitors 116 and 117, which are connected in series, and an inductor 121, which is configured as coil in the present case and which can simultaneously be considered to be a part of a coupling device 120, which will be described in more detail below. A voltage portion determined by the capacitance ratio of the capacitors 116 and 117 (capacitive voltage divider) is further fed back via the capacitor 117 to the emitter of the transistor 111, whereby a monitoring signal SM in the form of a periodic AC voltage signal can be generated as a whole.

The contact monitoring device 100 furthermore comprises a coupling device 120, which is connected downstream from the oscillator circuit or the signal generator 110, respectively. In the present case, the coupling device 120 is, for example, an inductive transmitter in the form of a transformer, which is configured to inductively couple the signal generator 110 to a sensing circuit 130, which will be described below in detail. For this purpose, the transformer has a first inductor 121 (e.g. a first planar coil) and a second inductor 122 (e.g. a second planar coil), wherein the first inductor 121 is inductively coupled to the second inductor 122. e.g. via a (non-illustrated) magnetic core. As mentioned above, the first inductor 121 in the present embodiment thereby fulfills a double function, in that it represents an element of the resonant circuit of the oscillator on the one hand, and forms the connection of the coupling device 120 to the signal generator 110, on the other hand. For a formally unambiguous assignment of the corresponding components, the first inductor 121, however, can be assigned to the signal generator 110, and the second inductor 122 or the magnetic core, respectively, to the coupling device 120. A galvanic separation between the signal generator 110 and the sensing circuit 130 preferably takes place by device of the coupling device 120.

The contact monitoring device 100 further comprises a sensing circuit 130, which is connected downstream from the coupling device 120 and which is connected to the changeover contact 2. The vibration behavior of the signal generator 110 and thus the monitoring signal SM and/or a signal derived from the monitoring signal (e.g. a current signal, if the monitoring signal is a voltage signal), can be changed as a function of a switching position of the changeover contact 2 by device of the above-mentioned sensing circuit 130, which is coupled to the signal generator 110 via the coupling device 120. The sensing circuit 130 is thereby in particular configured to change the monitoring signal SM generated by the signal generator 110 and/or the signal derived from the monitoring signal for at least three, preferably four, different switch positions of the changeover contact 2 in a different way, which will be described in more detail in connection with FIGS. 3 to 6. In the present case, the sensing ciruit 130) comprises, for example, a plurality of impedances, which is why the sensing circuit 130 can also be referred to as impedance circuit in this embodiment. To change or influence, respectively, the vibration behavior of the signal generator 110 or of the monitoring signal SM generated by it, respectively, the present sensing circuit 130 thereby generally comprises three impedances 131, 132, and 133, which are in each case assigned to one of the ports 2a, 2b, or 2c, respectively. A first impedance 131 is thereby coupled to the COM port 2a, a second impedance 132 to the NC port 2b, and a third impedance 133 to the NO port 2c. Depending on the dimensioning, one or several of these three impedances can thereby also be omitted or can be zero, respectively. Only in an exemplary manner, the first impedance 131, e.g., is zero or a simple direct electrically conductive connection, respectively, in the present embodiment. The second and third impedance 132 and 133 can further be realized, e.g., in the form of a sensing circuit of a second or third resistor 132a, 133a, respectively, and a second or third capacitor 132b, 133b, respectively.

The sensing circuit 130 can additionally also comprise further, but generally optional, impedances, in particular if the contact monitoring device 100 is part of a relay socket only in an exemplary manner as in the present embodiment, in the case of which the COM, NC, and NO port 2a. 2b. 2c is electrically connected to corresponding load ports 9a. 9b. 9c for connection to corresponding loads (here. e.g., load 12 or load 13, respectively). The COM port 2a. e.g., can thus be electrically connected to the load port 9a via a fourth impedance 134. The NC port 2b can be electrically connected to the load port 9b via a fifth impedance, and the NO port 2c can be electrically connected to the load port 9c via a sixth impedance. Depending on the dimensioning, individual ones of these optional impedances can also be omitted again, in turn. i.e. can be zero or direct electrical connections can be realized, respectively. e.g. via conductor tracks. In the present case, the fourth, fifth, and sixth impedance 134, 135, 136 are embodied in an exemplary manner in the form of ferrites, which are preferably of low impedance for low-frequency AC voltage signals and of high impedance for high-frequency AC voltage signals. The advantage of these further impedances. i.e. of the fourth, fifth, and sixth impedance 134, 135, 136 is thereby that attenuation can take place due to these high-frequency signals at the load ports 9*a*. 9*b*. 9*c* due to the coupling to the signal generator 110. It can thus be attained in an advantageous manner to functionally separate the contact monitoring device 100 from an external circuit at the load ports 9*a*. 9*b*. 9*c*, while low-frequency signals with high currents can simultaneously be efficiently conducted on ports 2*a*. 2*b*. 2*c*. In other words, the ports 9*a*. 9*b*, and 9*c*, viewed from the outside, are quasi identical to the respective ports 2*a*. 2*b*, and 2*c* due to the low impedances 134, 135, 136 for a useful signal, so that a relay socket with a contact monitoring device 100 according to the shown embodiment does not or hardly differ, respectively, from a common standard relay socket.

Additionally or alternatively, the optional impedances 137 and 138, which will be identified below as seventh impedance 137 and eighth impedance 138, can also be provided in the sensing or impedance circuit 130, respectively. These impedances 137 and 138 can serve different purposes. e.g., for the fault-free operation and independence of an external circuit. They can consist, only in an exemplary manner, of series resonant circuits with a seventh or eighth inductor 137*a*. 138*a*, respectively, and a seventh or eighth capacitor 137*b*. 138*b*, respectively, wherein the series resonance circuit preferably in each case comprises a series resonance frequency at an operating frequency of the signal generator 110. At the series resonance frequency, the impedance of the series resonance circuits is thus given only by device of resistive portions of the inductance and of the capacitance and are thus very low. On the one hand, a fed-in high-frequency voltage signal between the ports 9*a* and 9*b* or 9*a* and 9*c*, respectively, can be reduced thereby in an advantageous manner, and emitted electromagnetic interferences at the terminals can thus be minimized. On the other hand, the influencing of the sensing circuit 130 by device of possible connected loads can be minimized at the operating frequency of the signal generator 110 because they are connected parallel to the low impedances 137 and 138.

As a whole, all of the impedances, which are present in the sensing or impedance circuit 130, respectively, are dimensioned, if possible, so that they quasi do not represent an impairment for the useful signal. For example the capacitors 132*b*, 133*b*, 137*b*, and 138*b* of the impedances 132, 133, 137, and 138 can be very small, so that they are of extremely high impedance and are thus hardly or not noticeable, respectively, for the useful signal. In this respect, the sensing circuit 130 or the contact monitoring device 100, respectively, viewed from the outside, for a (DC or AC or low-frequency, respectively) useful signal acts so as not to be noticeable compared to a conventional circuit or simple connection, respectively. In other words, the components of the sensing circuit 130 are preferably dimensioned so that they do not influence the impedance between the ports 9*a*, 9*b*, and 9*c* at the operating frequency of the loads to be switched (typically direct current voltage or 50 Hz or 60 Hz, respectively). It is furthermore important to mention that the components, which are embodied in an exemplary manner in the present case as load ports 9*a*, 9*b*, 9*c*, do not necessarily actually have to be accessible ports. The corresponding components can thus also only be taps for internal signals of a complex product, e.g. of a product with several functional units, so that the ports 9*a*. 9*b*. 9*c* are only present indirectly or as internal signals/potentials, respectively.

Lastly, the contact monitoring device 100 also comprises an evaluation device 140, which is configured to detect the monitoring signal SM and/or the signal derived from the monitoring signal and/or a change of the monitoring signal SM and/or a change of the signal derived from the monitoring signal, in order to thus monitor the changeover contact 2. For this purpose, the evaluation device 140 can be connected, e.g. via a tap 118 to the signal generator 110, wherein the monitoring signal SM generated by the signal generator 110 is applied at the tap 118 a signal derived from the monitoring signal. In the present case, the evaluation device 140 is configured—only in an exemplary manner—in the form of a Greinacher circuit with two capacitors 141 and 142, two diodes 143 and 144, as well as resistor 145, wherein the circuit is configured to provide a rectified state signal SZ, which is proportional to the oscillation amplitude of SM. The state signal SM can thereby characterize the actual switching state of the changeover contact 2 and can subsequently be compared to, e.g., a target switching state signal, which is derived from a switching signal SS, which is generated by the control 8, for the changeover contact 2, in order to thus monitor a proper switching process or the state of the changeover contact 2, respectively.

Figure 3:
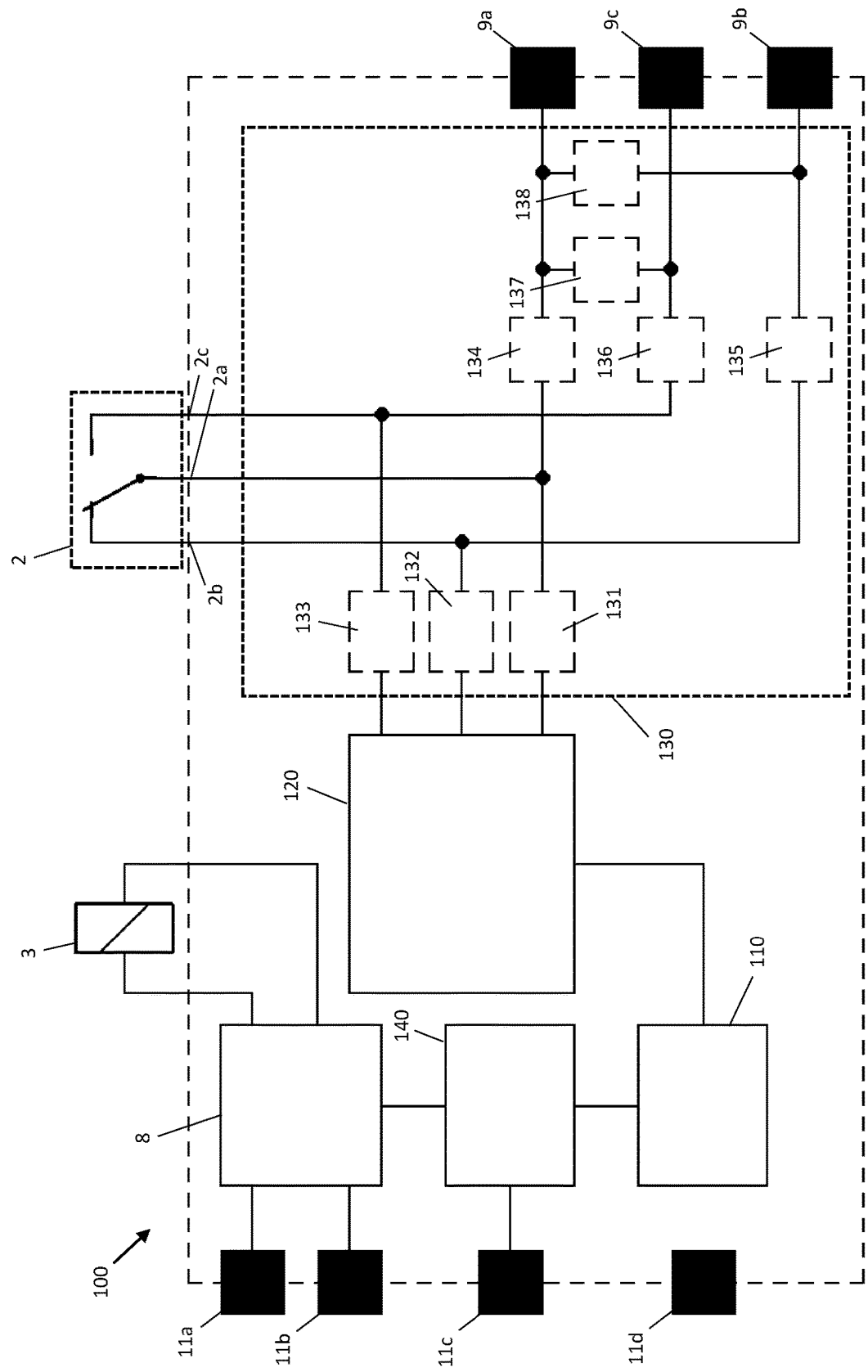
FIG. 3: shows a schematic illustration of a contact monitoring device for a three-pole changeover contact according to a further embodiment of the invention.

FIG. 3 shows a schematic illustration of a contact monitoring device 100 for a three-pole changeover contact 2 with three ports 2*a*, 2*b*, 2*c* according to a further embodiment of the invention. The setup thereby generally corresponds to the embodiment illustrated in FIG. 2, wherein only the essential components, without detailed circuits, are illustrated for the following discussion of the change or influencing, respectively, of the monitoring signal SM. The present embodiment of the contact monitoring device 100 additionally has a supply port 11*d* for the energy supply as well as two control ports 11*a* and 11*b*, which are connected to the control 8 for controlling the relay coil 3, and via which the switching state of the changeover contact 2 can be controlled, which, in the present case—again only in an exemplary manner—is configured as relay changeover contact. The evaluation circuit 140 is connected to the control 8 as well as to the signal generator 110. The evaluation device 140 is configured to compare an actual switching state of the changeover contact 2, which is monitored or determined by it, respectively, to a target switching state, which is specified by the control 8. A control signal, e.g., which indicates whether the specified target switching state and the monitored actual switching state of the changeover contact 2 correspond, can then be output via the output port 11*c*.

The monitoring of the actual switching state of the changeover contact 2 takes place in the evaluation device 140, for the purpose of which the monitoring signal SM, which varies as a function of the switch position of the changeover contact 2 and/or signal derived from the monitoring signal is detected. In the present embodiment, the changing or influencing, respectively, of the monitoring signal SM or of the signal derived from the monitoring signal, respectively, takes place by device of the different interconnection of the impedances 131-138 of the sensing circuit 130 as a function of the switch position of the changeover contact 2, so that, depending on the switch position of the changeover contact 2, a, preferably different, total impedance is coupled into the signal generator 110 via the coupling device 120, which total impedance, in turn, results in different amplitudes of the monitoring signal SM. In other words, four signal amplitudes of SM, which can be differentiated, can be generated by device of suitable dimensioning of the impedances for the typically four states of the changeover contact 2, which are to be differentiated, at the frequency of the signal generator 110, which signal amplitudes allow for an unambiguous assignment between signal amplitude and actual switch position—as will be described below in connection with FIG. 6.

FIG. 4 shows a tabular list of selected states of the changeover contact 2 and the interconnection of the impedances 131 to 138 of the sensing circuit 130 resulting therefrom as equivalent circuit diagram for the embodiments shown above in FIG. 2 or 3, respectively. Seventh and eighth impedance 137 and 138 are selected as zero thereby only in an exemplary manner in order to simplify the consideration. If the changeover contact 2 is in the "state 1", in the case of which the COM port 2a is connected to the NC port 2b, the first impedance 131 is electrically connected to the second impedance 132 and the total impedance ZNC of the corresponding impedance circuit follows from ZNC=((Z133+Z136+Z134)||(Z132))+Z131, whereby the symbol || symbolizes a parallel circuit and + symbolizes a series connection. The respective index of the impedances Z is to further refer to the corresponding referenced impedance of the sensing circuit 130. I.e., the specification "Z133" is to identify the impedance 133 in an abbreviated manner, the specification "Z134" is to identify the impedance 134 in an abbreviated manner, etc. If the changeover contact 2 is in the "state 2", at which the COM port 2a is connected to the NO port 2c, a total impedance ZNO of ZNO=((Z132+Z135+Z134)||Z133)+Z131 results. If the changeover contact 2 is in the "state 3", at which the COM port 2a is connected to the NC port 2b, whereby the latter is connected, in turn, to the NO port 2b, a total impedance ZS of ZS=(Z132||Z133)+Z131 results. If the changeover contact 2 is in the "state 4", at which no electrical connection whatsoever exists between the three ports 2a. 2b, and 2c, a total impedance ZO of ZO=((Z133+Z136)||(Z132+Z135))+Z131+Z134 results. As a whole, different total impedances. i.e. which are characteristic for a respective switching state, can be provided by device of a corresponding dimensioning of the respective impedances 131-138 for the individual switching states of the changeover contact 2. In the signal generator 110—conveyed by the coupling to the signal generator 110 via the coupling device 130—they then result in the generation of different monitoring signals SM, which are characteristic, i.e., for a respective switching state, which can then be evaluated by the evaluation device 140), in order to allow drawing conclusions to the corresponding switching state of the changeover contact 2.

Figure 5:
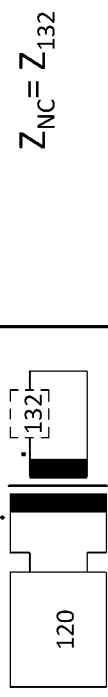
FIG. 5: shows a tabular list of selected states of the changeover contact and the interconnection of the impedances resulting therefrom for a further development of the embodiment described in FIG. 4.
Figure 5:
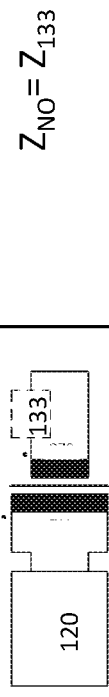
Figure 5:
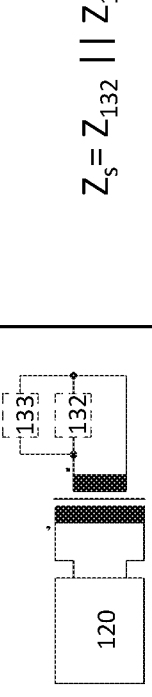
Figure 5:

FIG. 5 shows the tabular list according to FIG. 4 with the further development that the fifth and sixth impedance 135 and 136 are selected to be infinitely high, and the first and fourth impedance 131 and 134 are selected or approximated, respectively, as zero. In the switching state 1 of the changeover contact 2, the impedance 135 is bridged so that a total impedance ZNC=Z132 results. In the switching state 2, the impedance 136 is bridged, and the total impedance becomes ZNO=Z133. In the switching state 3, both impedances 135 and 136 are bridged, so that a total impedance ZS of ZS=Z132||Z133 results. In the switching state 4 of the changeover contact 2, none of the two impedances 135 and 136 is bridged and the total impedance ZO is a high impedance. It can be recognized, in turn, that different total impedances can be provided, which can be evaluated accordingly, by device of a suitable dimensioning of the impedances of the sensing circuit 130 as a function of the switch position.

Figure 6:
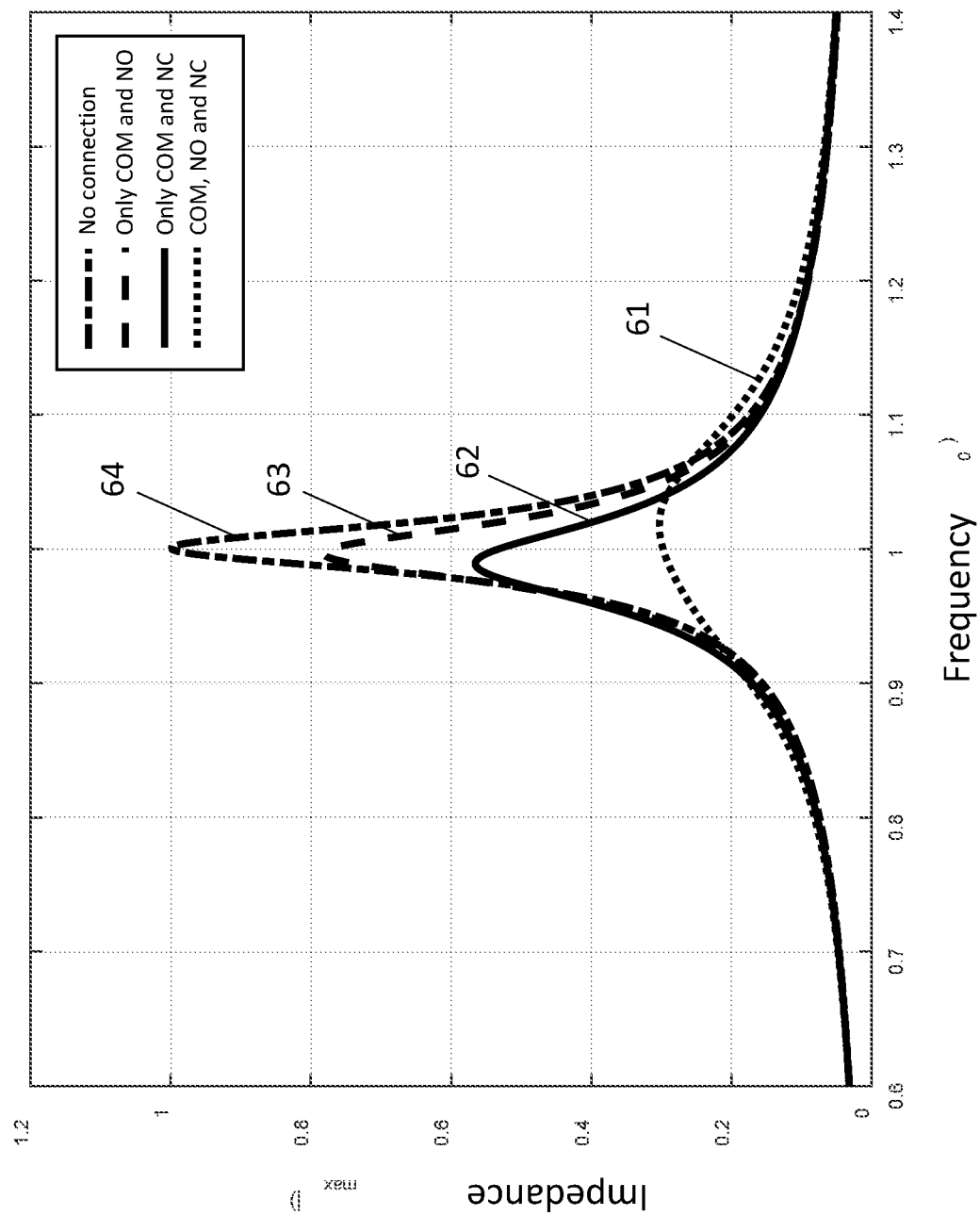
FIG. 6: shows frequency-dependent courses of the amount of the impedance at the signal generator side of the coupling device of a contact monitoring device in an embodiment for different states of the changeover contact.

FIG. 6 shows exemplary frequency-dependent courses of the amount of the impedance at the signal generator side of the coupling device 130) of a contact monitoring device 100) in an embodiment for four different states of the changeover contact 2. The corresponding changeover contact 2, in turn, is to thereby comprise a common COM port 2a, an NC port 2b, and an NO port 2c. The impedance curves 61, 62, 63, und 64-which will be identified below as first, second, third, and fourth impedance curve, for better differentiation-thereby have a maximum, which is a function of the switching state of the changeover contact 2. The first impedance curve 61 is thereby assigned to a switch position, in the case of which the COM, NC, and NO port 2a. 2b. 2c. i.e. all three ports, are connected. The second impedance curve 62 is assigned to a switch position, in the case of which only the COM port 2a and the NC port 2b are connected. The third impedance curve 63 is assigned to a switch position, in the case of which only the COM port 2a and the NO port 2c are connected. The fourth impedance curve 64 is assigned to a switch position, in the case of which no connection whatsoever exists between the COM, NC, and NO port 2a. 2b. 2c. The contact monitoring device 100 is configured by device of a corresponding dimensioning of the electrical components, in particular by device of a suitable selection of the impedances 132 and 133, in order to separate the impedance curves 61, 62, 63, and 64 by device of a largest possible amplitude difference.

Above, the focus was mainly on influencing or changing, respectively, the amplitude of the monitoring signal as a function of a varying total impedance for monitoring the changeover contact. It is immediately clear for the person of skill in the art, however, that other parameters of the monitoring signal. e.g. the frequency, phase position, decay behavior, runtime and/or signal form thereof, can also be used for the changeover contact monitoring via a corresponding adaptation of the units of the contact monitoring device. As can already be seen in FIG. 6, for example, the maximum of the impedance curves 61, 62, 63, and 64 is not exactly at the same frequency. In addition to the change of the amplitude of SM, the oscillator in the present embodiment thus in each case oscillates at the four switching states at a (slightly) different frequency. Due to systematic optimization of the impedances 131, 132, and 132—e.g. by using different capacitors in the impedances 131, 132, and 133, which, in combination with the inductor or the inductors 121, 122, respectively, of the coupling device 120, result in different LC resonance frequencies, depending on the contact state—the distance of the resonances. i.e. the maximum of the impedance curves 61, 62, 63, and 64 could be increased even further and a differentiation of the switch position could additionally or alternatively also be realized on the basis of the respective characteristic frequency change. Alternatively, it is also possible that the signal generator 110 generates a pulse-like monitoring signal SM, which is influenced to different extents or is attenuated, for example, to different extents, respectively, depending on the state of the changeover contact 2, by device of the different impedances 131 to 138, which, in turn, can be evaluated. In other words, the differentiation can thus also take place on the basis of a decaying or abating behavior, respectively, which is characteristic for the respective switching state.

Figure 7:
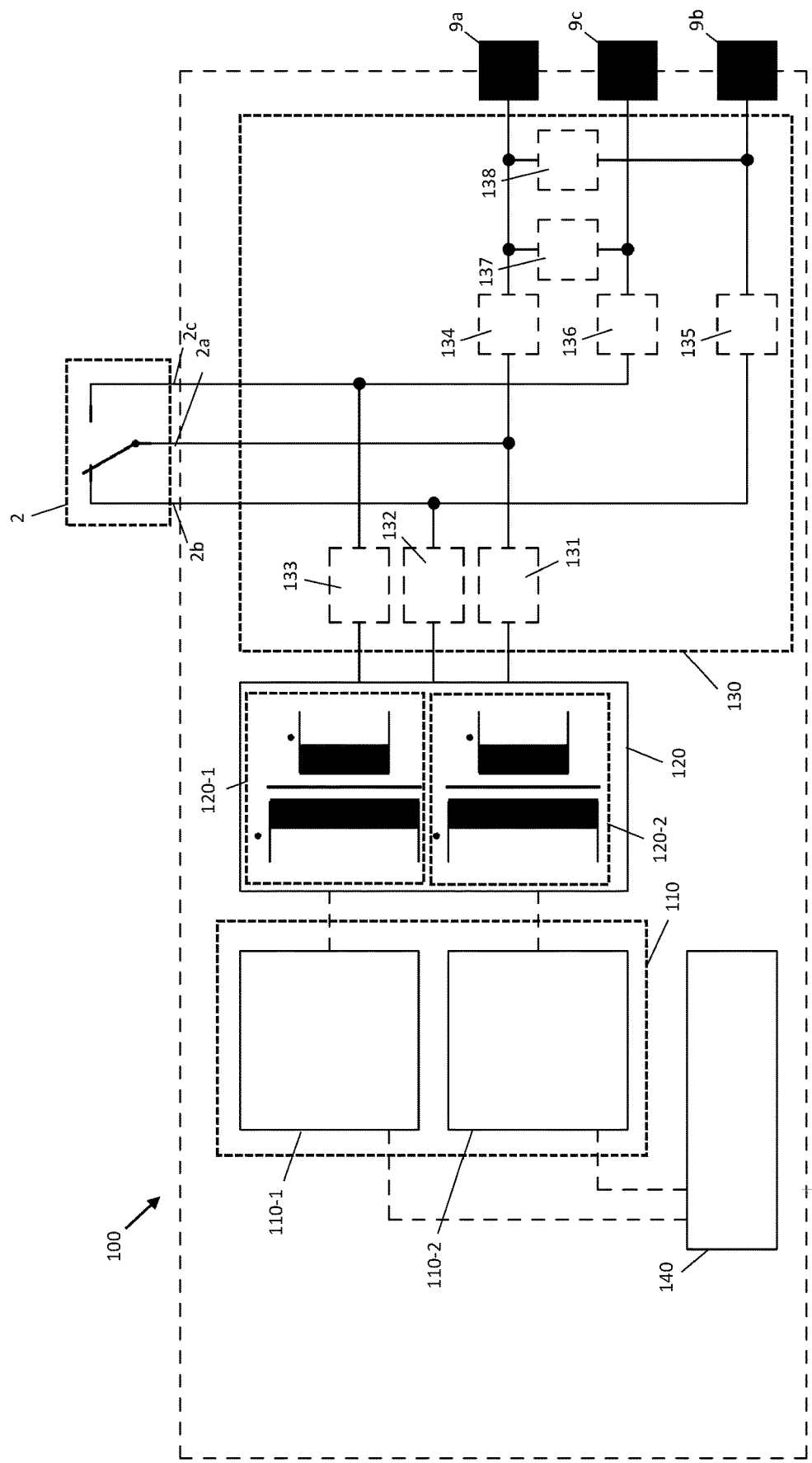
FIG. 7: shows a schematic illustration of a contact monitoring device for a three-pole changeover contact according to a further embodiment of the invention.

FIG. 7 shows a schematic illustration of a contact monitoring device 100 for a three-pole changeover contact 2 with three ports 2a. 2b, and 2c according to a further embodiment of the invention. In contrast to the previous embodiments, the monitoring signal SM in the present case comprises at least one first monitoring subsignal SM1 and a second monitoring subsignal SM2. For the generation thereof, the signal generator 110 of the contact monitoring device 100 in each case comprises a first signal generator device 110-1 (e.g. a first high-frequency generator) and a second signal generator device 110-2 (e.g. a second high-frequency generator). The first monitoring subsignal SM1 and the second monitoring subsignal SM2 can thereby include. e.g., different frequencies or can be generated at different points in time, only in an exemplary manner. In the present embodiment, the coupling device 120 furthermore comprises a first coupling element 120-1 (e.g. a first inductive transmitter) for coupling the first signal generator device 110-1 to the sensing circuit 130 and a second coupling element (e.g. a second inductive transmitter) for coupling the second signal generator device 110-2 to the sensing circuit 130. The sensing circuit 130, in turn, is configured to couple the first monitoring subsignal SM1 to a first port subset of the changeover contact 2 and to couple the second monitoring subsignal SM2 to a second port subset. In the present case, e.g., the first monitoring subsignal SM1 is to be coupled to the ports 2*a* and 2*b* and the second monitoring subsignal SM2 to the ports 2*a* and 2*c*. In other words, the switching state with respect to the ports 2*a* and 2*b* can be monitored by device of the first monitoring subsignal SM1, and the switching state with respect to the ports 2*a* and 2*c* can be monitored by device of the second monitoring subsignal SM2. I.e., the respective monitoring subsignals SM1 or SM, respectively, are to each react only to a change of a portion or a subset of the three ports 2*a*. 2*b*, 2*c* of the changeover contact 2. As a whole, the first monitoring subsignal SM1 and/or a signal derived from the first monitoring subsignal SM1 can thus be changed by device of the sensing circuit 130 as a function of a switch position of a first port subset of the changeover contact 2, and the second monitoring subsignal SM2 and/or a signal derived from the second monitoring subsignal SM1 can be changed as a function of a switch position of a second port subset of the changeover contact 2, which can be attained, e.g., by device of a corresponding dimensioning of the impedances 131-138 of the sensing circuit 130. Lastly, the contact monitoring device 100, in turn, comprises an evaluation device 140, which is configured to detect the first and second monitoring subsignal SM1 and SM2 and thus the monitoring signal SM, in order to thus monitor the changeover contact 2. Additionally or alternatively, the evaluation device 140 can also be configured to detect a signal derived from the first and/or second monitoring subsignal SM1 and SM2, in order to thus monitor the changeover contact 2. As will be described below in connection with FIG. 8, four different switch positions of the changeover contact 2 can be reconstructed via a corresponding logic.

FIG. 8 shows a tabular list of selected states of the changeover contact 2 and the monitoring signals SM1, SM2, and SM resulting therefrom for the embodiment shown in FIG. 7. In the present case, digital signals are thereby generated in an exemplary manner from the two signals SM1, SM2 with the respective states 1 (closed) and 0 (open). It goes without saying that this can also be realized the other way round. As described, the total of 4 changeover contact states can be reconstructed therefrom via a suitable logic.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 2 changeover contact
2*a* COM port
2*b* NC port
2*c* NO port
3 relay coil
3*a*, 3*b* relay coil port
4 magnetic core
5 relay socket
6 slide
7*a* COM contact pellet
7*b* NC contact pellet
7*c* NO contact pellet
8 control
9*a*, 9*b*, 9*c* load port
10 relay
11*a*, 11*b* control port
11*c* output port
11*d* supply port
12, 13 Load
100 contact monitoring device
110 signal generator
110-1 first signal generator device
110-2 second signal generator device
111 transistor
112, 113 resistor
114 emitter resistor
115, 116, 117 capacitor
118 tap
120 coupling device
120-1 first coupling element
120-2 second coupling element
121 first inductor
122 second inductor
130 sensing circuit
131 first impedance
132 second impedance
132*a* second resistor
132*b* second capacitor
133 third impedance
133*a* third resistor
133*b* third capacitor
134 fourth impedance
135 fifth impedance
136 sixth impedance
137 seventh impedance
137*a* seventh inductor
137*b* seventh capacitor
138 eighth impedance 138a eighth inductor
138b eighth capacitor
140 evaluation device
141, 142 capacitor
143, 144 diode
145 resistor

The invention claimed is:

1. A contact monitoring device for monitoring an electrical, three-pole changeover contact, comprising:
   a signal generator, which is configured to generate a monitoring signal;
   a coupling device, which is connected downstream from the signal generator;
   a sensing circuit, which is connected downstream from the coupling device and which is coupled or can be coupled to the changeover contact,
   wherein the sensing circuit comprises one or several impedances and is configured to provide, at the coupling device, a total impedance, which varies with a switch position of the changeover contact,
   wherein the monitoring signal generation of the signal generator and thus the monitoring signal and/or a signal derived from the monitoring signal can be changed as a function of a switching position of the changeover contact by means of the sensing circuit, which is coupled to the signal generator via the coupling device;
   an evaluation device, which is configured to detect the monitoring signal and/or the signal derived from the monitoring signal and/or a change of the monitoring signal and/or a change of the signal derived from the monitoring signal, in order to thus monitor the changeover contact,
   wherein the sensing circuit is configured to change a resonance state of the signal generator, as a changed resonance state, for the monitoring signal and/or the signal derived from the monitoring signal in a different way for at least three different switch positions of the changeover contact.

2. The contact monitoring device of claim 1, wherein the changed resonance state comprises a change in an amplitude, a frequency, a phase position, a decay behavior, a runtime, and/or a signal form of the monitoring signal, and/or of the signal derived from the monitoring signal, as a function of the switch position of the changeover contact.

3. The contact monitoring device of claim 1, wherein the changeover contact comprises a common (COM) port, a normally closed (NC) port, and a normally open (NO) port, and
   wherein the sensing circuit is configured to change the monitoring signal and/or the signal derived from the monitoring signal in a different way in each case for at least three or all of the following switch positions:
   a) no connection between COM, NC, and NO port;
   b) only the COM port and the NC port are connected;
   c) only the COM port and the NO port are connected;
   d) only the NC port and the NO port are connected;
   e) COM, NC, and NO port are connected.

4. The contact monitoring device of claim 1, wherein the sensing circuit is configured to provide a respective different total impedance at the coupling device for at least three switch positions of the changeover contact.

5. The contact monitoring device of claim 1, wherein the sensing circuit comprises:
   a) a first impedance, which is coupled to a first port of the changeover contact; and/or
   b) a second impedance, which is coupled to a second port of the changeover contact; and/or
   c) a third impedance, which is coupled to a third port of the changeover contact.

6. The contact monitoring device of claim 1, wherein the sensing circuit comprises one to three further impedances, and
   wherein a respective impedance is in each case connected downstream from a port of the changeover contact, in order to attenuate high-frequency signals, which are applied by the coupling device at the changeover contact and/or at an electrical load and/or voltage source coupled to the changeover contact.

7. The contact monitoring device of claim 1, wherein the sensing circuit comprises at least one further impedance, and
   wherein the at least one further impedance is connected between two ports of the changeover contact, in order to attenuate high-frequency signals between the ports of the changeover contact.

8. The contact monitoring device of claim 1, wherein the changeover contact comprises a changeover contact of a relay, and/or
   wherein the contact monitoring device is part of a relay socket.

9. The contact monitoring device of claim 1, wherein
   a) the coupling device comprises an inductive transmitter; and/or
   b) the coupling device comprises a transformer, which comprises a first inductor and a second inductor, wherein the first inductor is inductively coupled to the second inductor; and/or
   c) the coupling device is configured to galvanically separate the signal generator and the sensing circuit; and/or
   d) the coupling device is configured of at least two electromagnetically coupled antennas; and/or
   e) the coupling device comprises at least two capacitors.

10. The contact monitoring device of claim 1, wherein
   a) the signal generator comprising a high-frequency generator, which is configured to generate a high-frequency monitoring signal with a frequency of at least 10 KHz; and/or
   b) the signal generator comprises a Colpitts oscillator circuit; and/or
   c) the signal generator is connected to the changeover contact via the coupling device and the sensing circuit.

11. The contact monitoring device of claim 1, wherein the signal generator comprises a tap and is configured to provide the monitoring signal and/or the signal derived from the monitoring signal, via the tap.

12. The contact monitoring device of claim 1, wherein the monitoring signal comprises at least a first monitoring subsignal and a second monitoring subsignal, and
   wherein the first monitoring subsignal and/or a signal derived from the first monitoring subsignal can be changed by the sensing circuit as a function of a switching position of a first port subset of the changeover contact, and the second monitoring subsignal and/or a signal derived from the second monitoring subsignal can be changed as a function of a switching position of a second port subset of the changeover contact.

13. The contact monitoring device of claim 12, wherein
   a) the signal generator comprises a first signal generator device for generating the first monitoring subsignal and a second signal generator device for generating the second monitoring subsignal; and/or
   b) the coupling means comprises a first coupling element for coupling the first signal generator device to the sensing circuit and a second coupling element for coupling the second signal generator device to the sensing circuit; and/or c) the sensing circuit is configured to couple the first monitoring subsignal to a first port subset of the changeover contact and the second monitoring subsignal to a second port subset.

14. The contact monitoring device of claim 1, wherein the evaluation device is configured to output a state signal, which indicates the switch positions of the changeover contact, as a function of the monitoring signal and/or of the signal derived from the monitoring signal.

15. The contact monitoring device of claim 1, wherein the evaluation device is configured to detect a switching signal for switching the changeover contact and is configured to output a control signal, which indicates whether the changeover contact is switched according to the switching signal, as a function of the switching signal and of the change of the monitoring signal and/or of the change of the signal derived from the monitoring signal.

16. The contact monitoring device of claim 15, wherein the evaluation device is configured to detect the monitoring signal and/or the signal derived from the monitoring signal and/or the change of the monitoring signal within a predetermined time interval, with the receipt of the switching signal, in order to determine whether the changeover contact is switched according to the switching signal within the predetermined time interval.

17. The contact monitoring device of claim 1, wherein
a) the contact monitoring device comprises a control for controlling the switching state of the changeover contact; and/or
b) the contact monitoring device and the changeover contact are encased by a common housing.

18. The contact monitoring device of claim 1, wherein the coupling device comprises an inductive coupling device.

19. The contact monitoring device of claim 1, wherein the monitoring signal comprises a high frequency signal with a frequency of at least 10 KHz.

* * * * *